United States Patent [19]

Ross et al.

[11] Patent Number: 5,056,296
[45] Date of Patent: Oct. 15, 1991

[54] ISO-THERMAL SEAL PROCESS FOR ELECTRONIC DEVICES

[75] Inventors: Richard J. Ross, Moraga; Jerry E. Campbell, Pacheco, both of Calif.

[73] Assignee: R. J. R. Polymers, Inc., San Francisco, Calif.

[21] Appl. No.: 502,558

[22] Filed: Mar. 30, 1990

[51] Int. Cl.⁵ .................. B65B 7/28; B65B 51/10
[52] U.S. Cl. ........................ 53/478; 53/141; 53/329.2; 53/374.9; 29/743; 29/841; 156/69; 156/499
[58] Field of Search ............... 53/478, 141, 374.9, 53/329.2; 29/841, 743; 156/69, 292, 285

[56] References Cited

U.S. PATENT DOCUMENTS

| | | | |
|---|---|---|---|
| 2,252,779 | 8/1941 | Moore | 53/478 X |
| 2,710,713 | 6/1955 | Slater | 53/478 X |
| 3,060,652 | 10/1962 | Eckman | 53/478 |
| 3,098,916 | 7/1963 | Souligney | 53/478 X |
| 3,152,944 | 10/1964 | Mojonnier et al. | 156/499 X |
| 3,160,999 | 12/1964 | Lee | 53/478 |
| 3,216,874 | 11/1965 | Brown | 156/69 |
| 3,557,520 | 1/1971 | Morton, Jr. et al. | 53/478 X |
| 4,507,907 | 4/1985 | Wolfson | 156/69 X |
| 4,519,859 | 5/1985 | Roth et al. | 156/69 |
| 4,631,815 | 12/1986 | Bocchicchio et al. | 29/743 X |
| 4,707,213 | 11/1987 | Mohr et al. | 53/373 X |
| 4,909,022 | 3/1990 | Kubis et al. | 53/373 X |

Primary Examiner—Horace M. Culver
Attorney, Agent, or Firm—Skjerven, Morrill, MacPherson, Franklin & Friel

[57] ABSTRACT

An apparatus and process for iso-thermally sealing electronic packages with a thermosetting adhesive have first and second platens for holding and for heating a package and a lid, respectively. The second platen is operatively coupled to the first platen, so that alignment of the package to the lid is automatically achieved when the first platen and the second platen are placed in a sealing position. The process includes the steps of preheating a package and a lid, the lid having a mating surface coated with a thermosetting adhesive; and mating together the heated package and the heated lid when iso-thermal conditions are achieved. The iso-thermal seal process and apparatus are based on the principle of uniting the package and the lid with a thermosetting adhesive after all three components, and gases in the cavity as well, are already at a stable adhesive curing temperature.

28 Claims, 7 Drawing Sheets

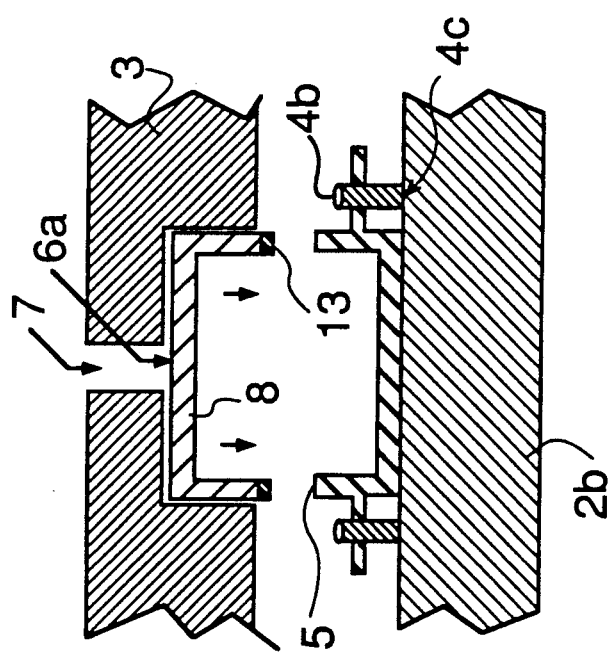
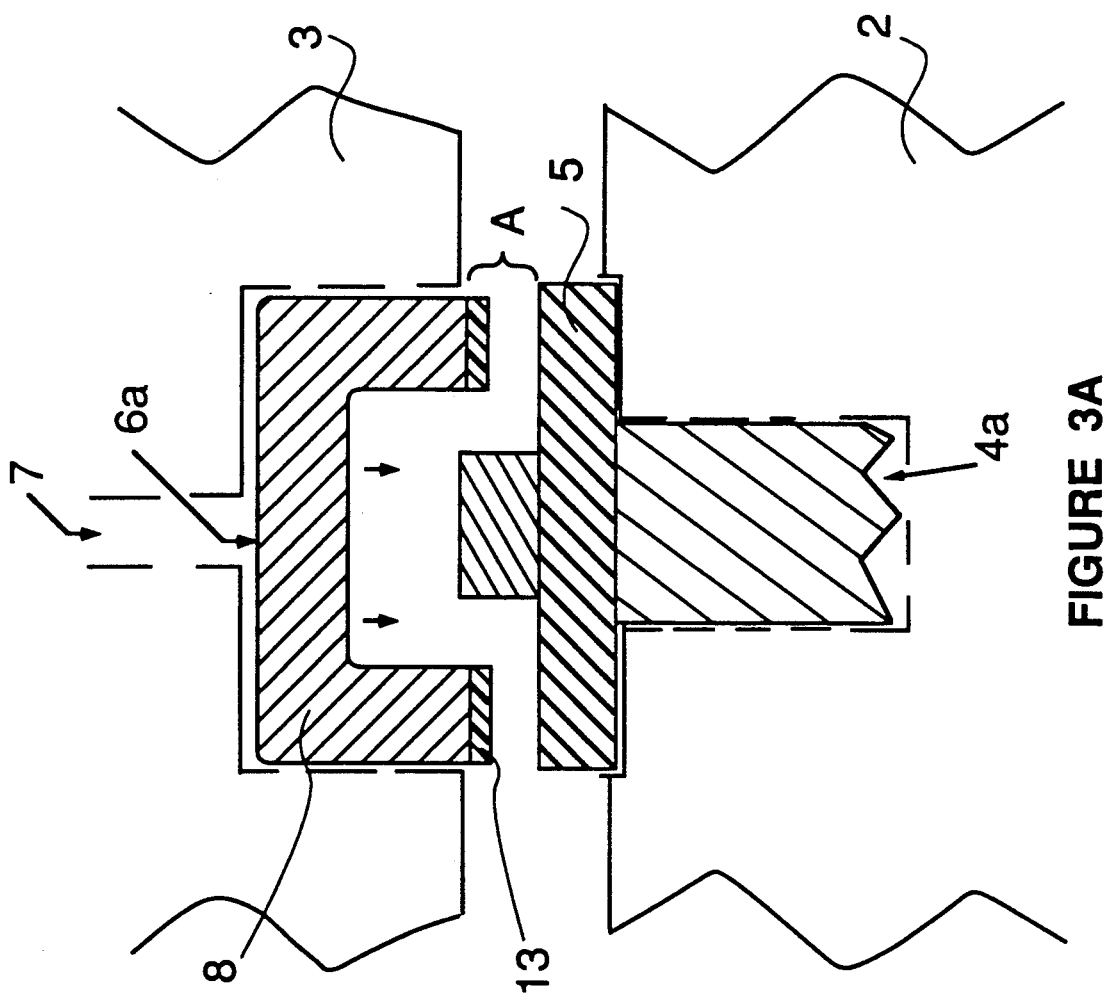
FIGURE 3B
FIGURE 3A

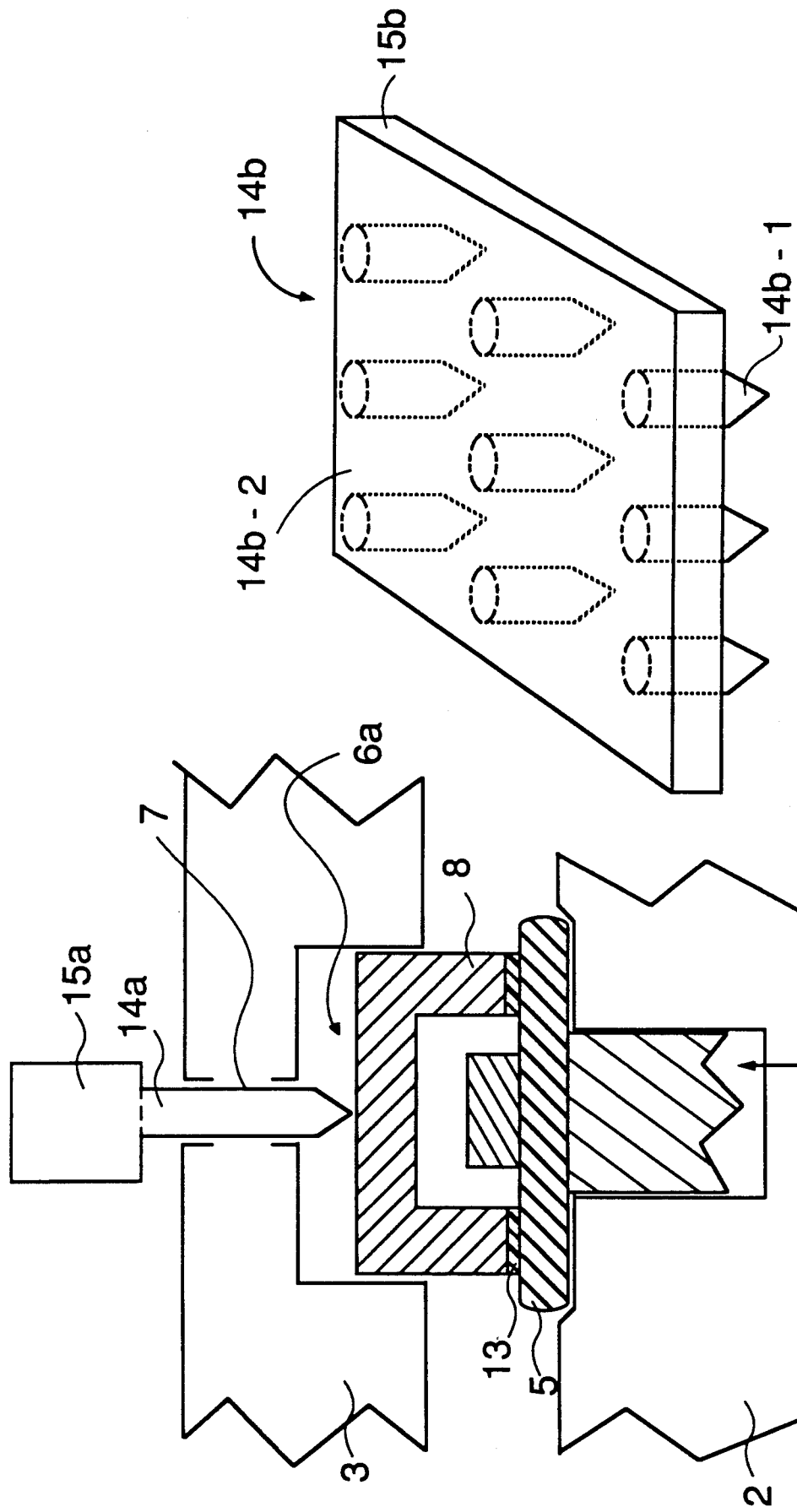

ISO-THERMAL SEAL PROCESS FOR ELECTRONIC DEVICES

BACKGROUND OF THE INVENTION

1. Field of the Invention

This invention relates to a sealing process and sealing apparatus using adhesives to seal electronic packages.

2. Description of the Prior Art

One conventional method for sealing electronic packages uses organic adhesives to attach a package base and a package lid together. An organic adhesive is typically applied to the mating surface of the package or to the lid (or possibly both) and the two parts are put into contact and aligned. Pressure is applied to the package/adhesive/ lid interfaces while the package, lid, and the adhesive therebetween are heated until the adhesive is cured.

The conventional method for sealing electronic packages can use a paste adhesive or a Beta-stageable adhesive for sealing. The paste adhesives typically have a viscosity between 30,000 and 300,000 cps and ideally have flow characteristics which allow the adhesive to flow only as pressure is applied. In this way, an adhesive with paste-like consistency can be applied manually or automatically to the mating surfaces of the package or lid with a syringe, for example, and the adhesive should not spread beyond the mating surfaces to contaminate other surfaces of the electronic package after it is applied. Nevertheless, handling of packages and lids with a fluid or paste adhesive applied thereto is difficult. The paste adhesive will have a tendency to flow even without pressure due to temperature and surface characteristics of the mating surfaces. Moreover, the fluidity of the adhesive is not readily amenable to alignment adjustments made when the package and lid are mated together.

Beta-stageable adhesives are another form of adhesive for sealing packages. Characteristically, beta-stageable adhesives are in a tack-free, semi-solid state and are available in the form of a film or sheet, for example. The semi-solid state is advantageous to sealing packages according to the conventional method because beta-stageable adhesives are tack-free until heated to about 50° C. This is advantageous to the handling of packages and lids until the parts are mated and aligned together, thereby avoiding liquid handling and hazards associated with solvents for clean-up. Also, tooling can be made to cut the adhesive into a preform of any desired dimensional shape for package sealing. The adhesive user can specify the dimensions needed and the adhesive manufacturer will tool up to create the desired shape preforms (typically resembling that of a gasket) usually with a one-time tooling cost per package specification.

Alternatively, the adhesive manufacturer can apply the beta-stageable adhesive to the packages or lids for the user and sell the adhesive according to the cost incurred for preapplying it to the customer's packages or lids. In that case, the customer will typically supply the packages or lids to the adhesive manufacturer for this purpose.

Current state-of-the-art technology relies on the application of mechanical force to the pre-aligned package and lid prior to the application of heat to flow and cure an adhesive. In some instances, lids are initially tacked in place by pre-heating the adhesive to about 80° C. while mating the lid and package. Under such conditions, the adhesive acts as a pressure sensitive adhesive, like cellophane tape, to hold the lid in position while a clamping device is applied. Usually the tacked assembly is allowed to cool to room temperature before it is clamped and placed in an oven to achieve the seal and cure the adhesive.

Regardless of the mode of applying the beta-staged adhesive, essentially all electronic package sealing is accomplished by starting with the assembly of a package and a lid with an adhesive at or near room temperature with mechanical force applied to cause the adhesive to flow and keep the assembly in alignment when heat is applied. The procedure is useful, but typical reject rates due to a condition called "blowout" range from about 3% to as much as 50%. Part of the blowout problem is due to lot-to-lot variations in the adhesives used combined with dimensional variations in the lid or package. However, the major cause of blowout is the thermodynamics of the heat sealing process itself.

When a clamped package and lid having adhesive therebetween is placed in an oven, its temperature will rise to the oven set temperature by conduction, convection, or radiation heating, or a combination of all three conditions. At a temperature of about 50° C. the adhesive will become soft and sticky and the clamping force will cause it to flow and make a gas tight seal. The seal entraps and contains whatever volume of gas is in the package at that moment in time and temperature. However, the assembly continues to warmup to the oven set temperature, which typically is 150° C. to 175° C. This causes the gas pressure in the cavity of the package to rise. At the same time, the higher temperature causes the adhesive to become thinner (lower viscosity) and diminishes its ability to hold the gas in the cavity. Usually, gas bubbles will penetrate the seal during this heat-up cycle, but the fluid adhesive will reflow and "heal" the hole made by the gas bubble.

Typically, beta-staged adhesives used for package sealing will "gel" or set in less than 30 minutes at the normal cure temperatures in the range of 150° C. to 175° C. However, this phenomenon is not instantaneous. The material will thicken and resist flow well before it is cured. If an out-gassing bubble occurs after the adhesive thickens, the hole made by the bubble penetrating through the seal may not heal and the result is a package which will leak because of a blowout. Anomalies in the mating surfaces of the package and lid due to lead penetrations, lack of flatness, or other minor defects usually found in commercial electronic packages and lids further compound the blowout sensitivity. Finally, all beta-staged materials in commercial use in 1990 have room temperature shelf lives of six months or less. This means that the chemical curing reaction is taking place very slowly, but the material is constantly changing. Therefore, at the point of use, each lot of adhesive is different, not only because of normal batch-to-batch tolerances, but also because of the age of the adhesive and the conditions associated with shipping and storage of the adhesive. Superimposed on this are other manufacturing factors like variations in clamping force, oven temperature uniformity, and operator error, so that it is easy to understand why the wide variations in defects and sealing yield losses occur from day to day and lot to lot.

It would be desirable if a process could be developed which is not sensitive to the variations and limitations described above for the state of the art.

SUMMARY OF THE INVENTION

Therefore, it is an object of the present invention to provide a process which minimizes "blow-out".

It is also an object of the present invention to provide a process which facilitates handling, mating, and alignment of electronic packages and lids for sealing.

According to the objects of the invention an apparatus for sealing electronic packages is provided which comprises a first platen for holding a package, said first platen having a first means for heating said first platen and said package; and a second platen for holding a lid, said second platen having a second means for heating said second platen and said lid, said second platen being operatively coupled to said first platen, so that alignment of said package to said lid is automatically achieved when said first platen and said second platen are placed in a sealing position.

Also a process is provided which uses the apparatus according to the invention to create adhesive-sealed electronic packages in high yields. The process according to the invention comprises the steps of preheating a package and a lid, said lid having a mating surface coated with adhesive; and mating together said heated package and said heated lid.

The iso-thermal seal process and apparatus eliminate most of the factors which cause blowout yield losses because it is based on the principal of uniting the package and lid with an adhesive after all three components, and the gases in package cavity as well, are already at the curing temperature. This constant curing temperature, which is tightly controlled, is maintained until the adhesive is set and sufficiently stable to withstand handling and/or cooling while maintaining seal integrity. Clamping is not necessary and only enough pressure to cause the adhesive to flow is needed on a momentary basis (one or two seconds) prior to the gelation of the adhesive. The pressures required are about 10% of those used in standard industry practice.

BRIEF DESCRIPTION OF THE DRAWINGS

FIG. 3A is a cross sectional view illustrating a package and a lid being held in a sealing position in a first and preferred embodiment before the lid is released from the holding means.

FIG. 3B is a cross sectional view illustrating a package and a lid being held in a sealing position in a second embodiment of the invention.

FIG. 4A is a cross-sectional view illustrating means for contacting the lid when the apparatus of the present invention is in the sealing position having a weight means for applying pressure.

FIG. 4B is a plan view illustrating a plurality of means for contacting the lid having platen weight means for applying pressure.

DETAILED DESCRIPTION OF THE INVENTION

Figure 1:
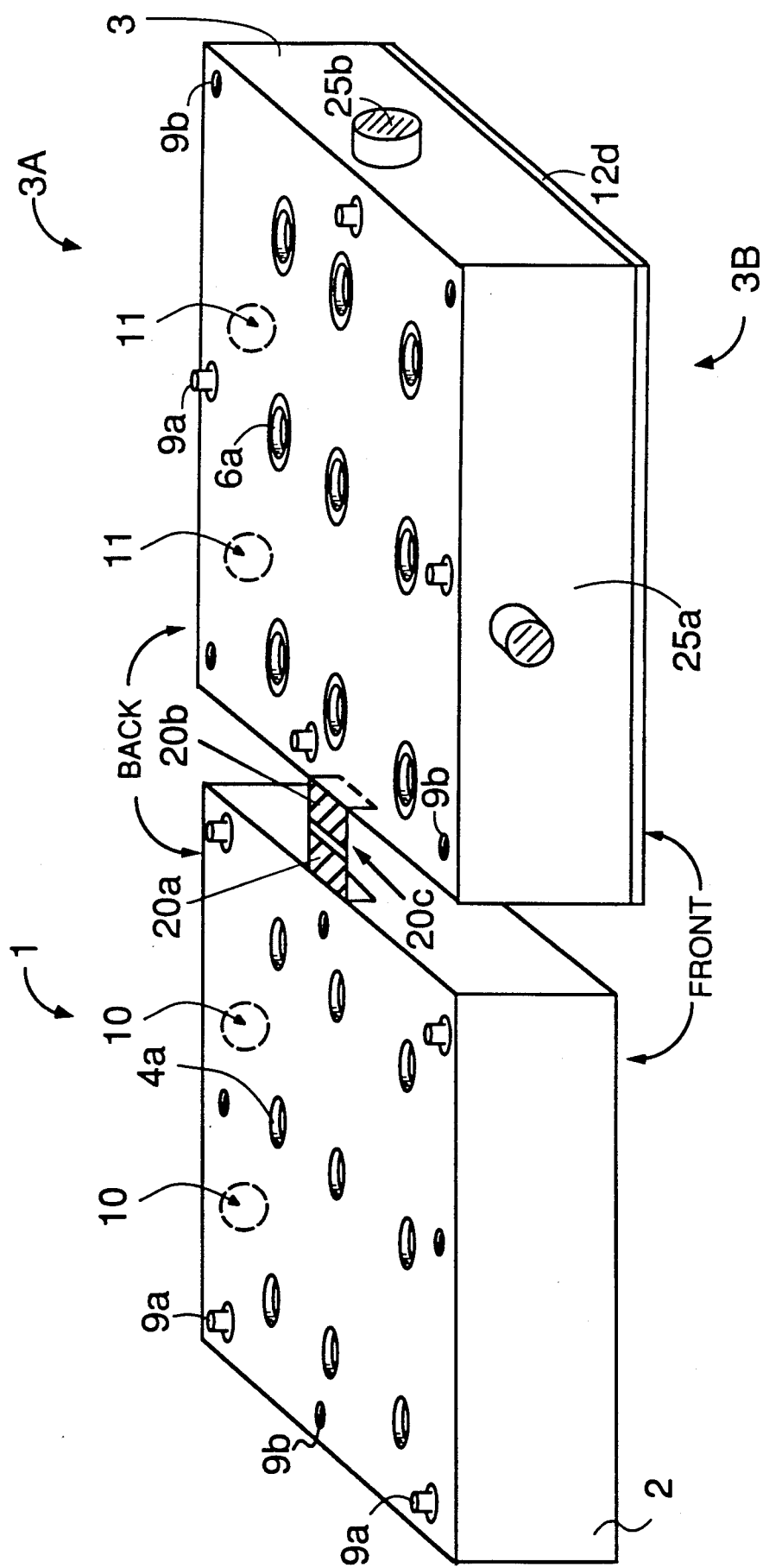
FIG. 1 is a perspective view illustrating the first platen and the second platen of the present invention in an open position.

A fixture or apparatus 1 for performing the iso-thermal seal process is illustrated in FIG. 1 and comprises a matched metal die means for sealing having two main components; a first platen 2 and a second platen 3. The first platen 2 and second platen 3 are made of metal, such as steel, or alloys of steel, copper, and preferably a metal having high thermal conductivity, such as aluminum which has been machined and anodized. Aluminum is preferred because of its excellent heat transfer characteristics, resulting in rapid heat response and temperature uniformity. First platen 2 has package locator means 4, or a plurality of package locator means 4, dimensionally configured and located to accommodate a package 5 (not shown) to be sealed.

Since package 5 can be of numerous shapes and sizes, package locator means 4 has numerous configurations. One means for locating a package 5 on first platen 2 is a slot 4a machined in first platen 2. Slot 4a is machined to custom fit each package 5 type. Alternatively, a mean for locating a package 5 on first platen 2b is a plurality of package locator pins 4b, as illustrated in FIG. 3B. Locator pins 4b can be purchased as open stock as standard dowel pins from most suppliers, preferably made from heat-treated steel to withstand wear and tear from repeated use. For the second embodiment, the standard dowel pins were obtained from Mr. Metric of California. The locator pins 4b are mounted in first platen 2b using bushing 4c, also made of harden steel and are placed so that any particular package 5 configuration can be located on first platen 2b and aligned accurately for the sealing process.

Figure 6A:
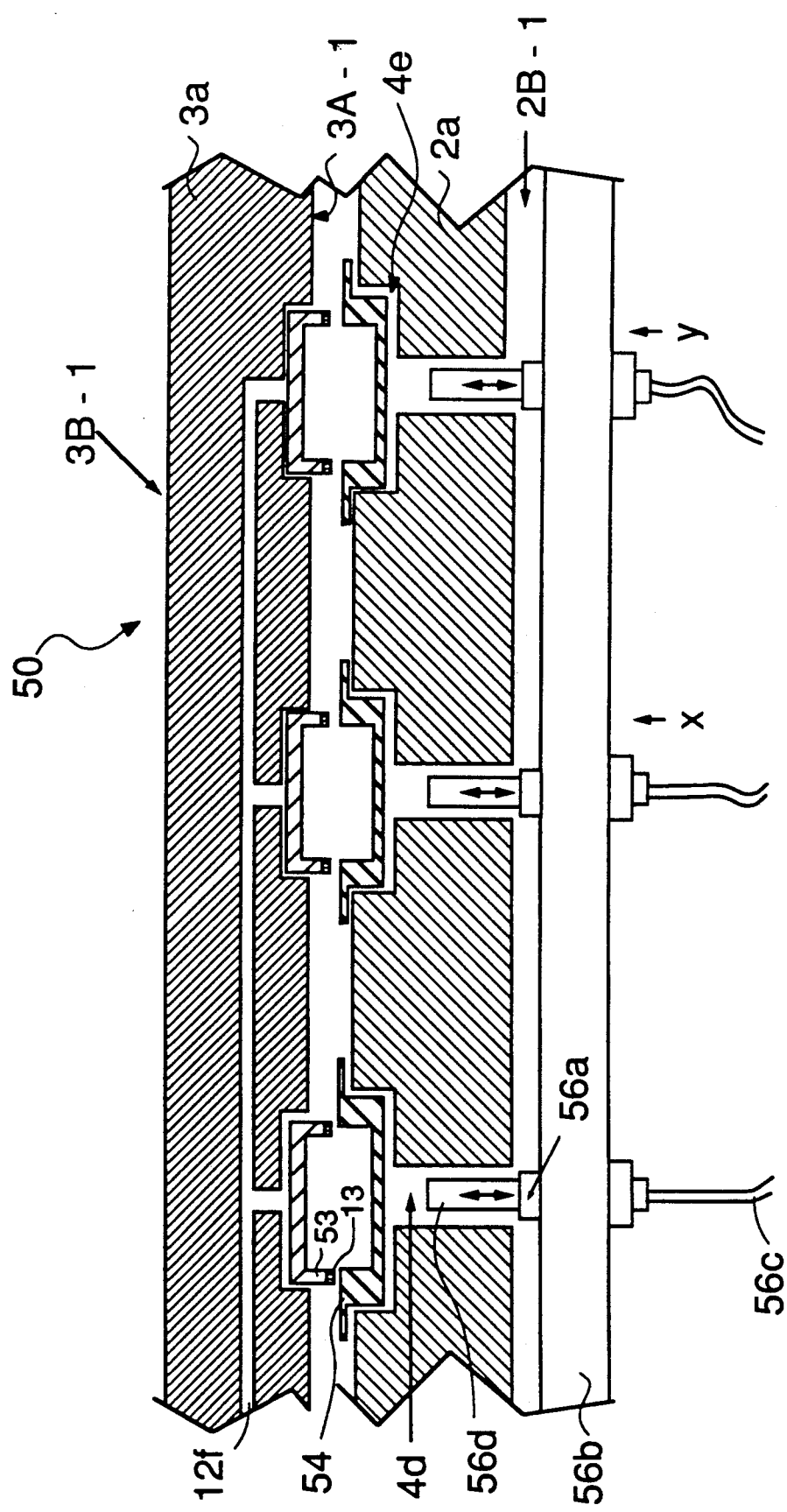
FIG. 6A illustrates a third embodiment of the present invention in the sealing position.
Figure 6B:
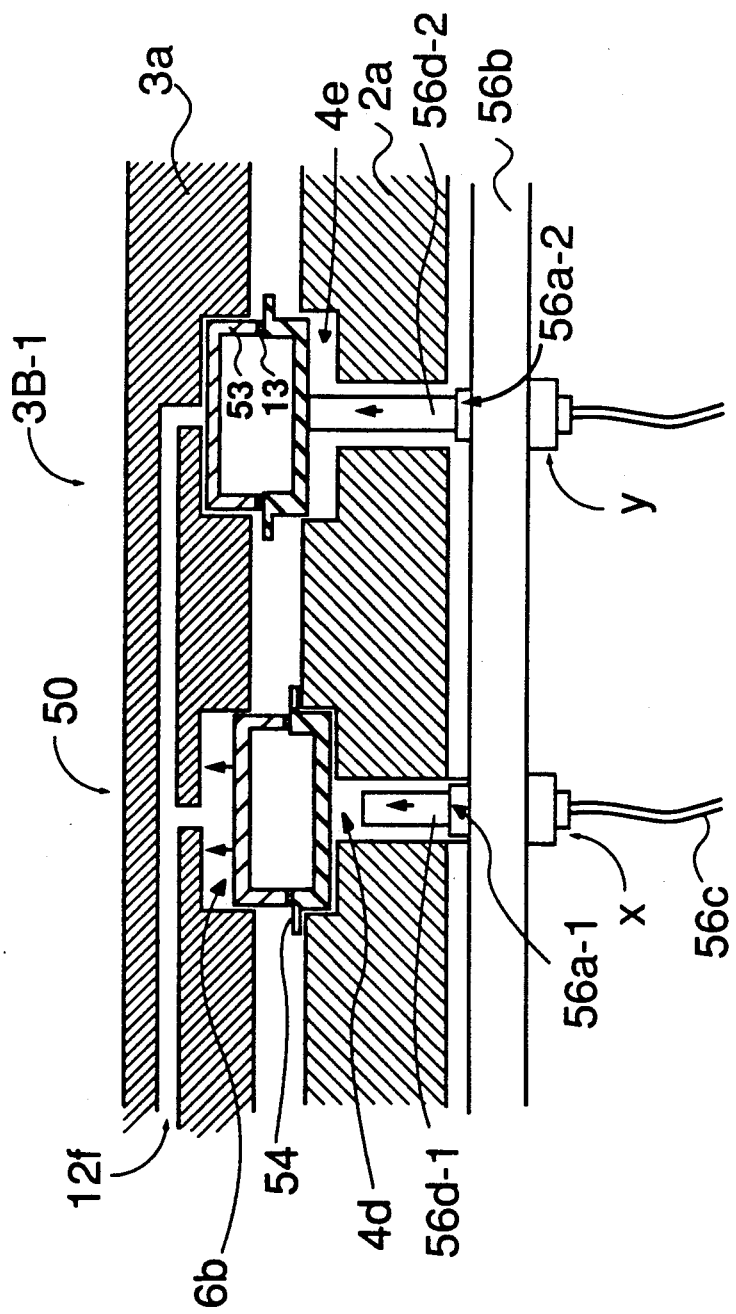
FIG. 6B illustrates the embodiment in FIG. 6A when lids are released before and after pressure is applied to the package.

In a third embodiment of the invention, slots 4e were used to locate packages 5 in first platen 2a, wherein first platen 2a further comprised first through-holes 4d operatively associated with slot 4e. First through-holes 4d extend internally from slot 4e through first platen 2a to side 2B-1 of first platen 2a. First through-holes 4d and the third embodiment are illustrated in FIGS. 6A and 6B and described in more detail below.

Second platen 3 has been machined with a lid locator means 6 for accurately placing a lid 8 (not shown) to be mated with package 5. Lid locator means 6 is designed to accommodate the numerous shapes and sizes of lid 8. Lid locator means 6 is preferably a receptacle 6a. Receptacle 6a, or a plurality thereof, is machined in second platen 3 to locate any particular lid 8 configuration on second platen 3 and align lid 8 accurately for the sealing process. In the preferred embodiment, receptacle 6a has second through-hole 7 operatively associated therewith.

Package locator means 4 and lid locator means 6 are made to be within tight tolerances to the respective package 5 and lid 8 dimensions. First platen 2 and second platen 3 can be customized for any size package 5 and lid 8 and any package or lid material. As the aluminum platens are used repeatedly, package locator means 4 and lid locator means 6 wear down and become larger. This is especially true when ceramic package/lid materials are used because of their abrasiveness. As a result, the tight tolerances are no longer maintained. Therefore, first and second platens 2, 3 are anodized in each embodiment so that at least package locator means 4 and lid locator means 6 wear more slowly. For the preferred embodiment, the aluminum is anodized by creating a 0.0002 to 0.0040 inch thick oxide layer. As mentioned previously, locator pins 4b are made of heat-treated or hardened steel to withstand the wear and tear described here.

Figure 2:
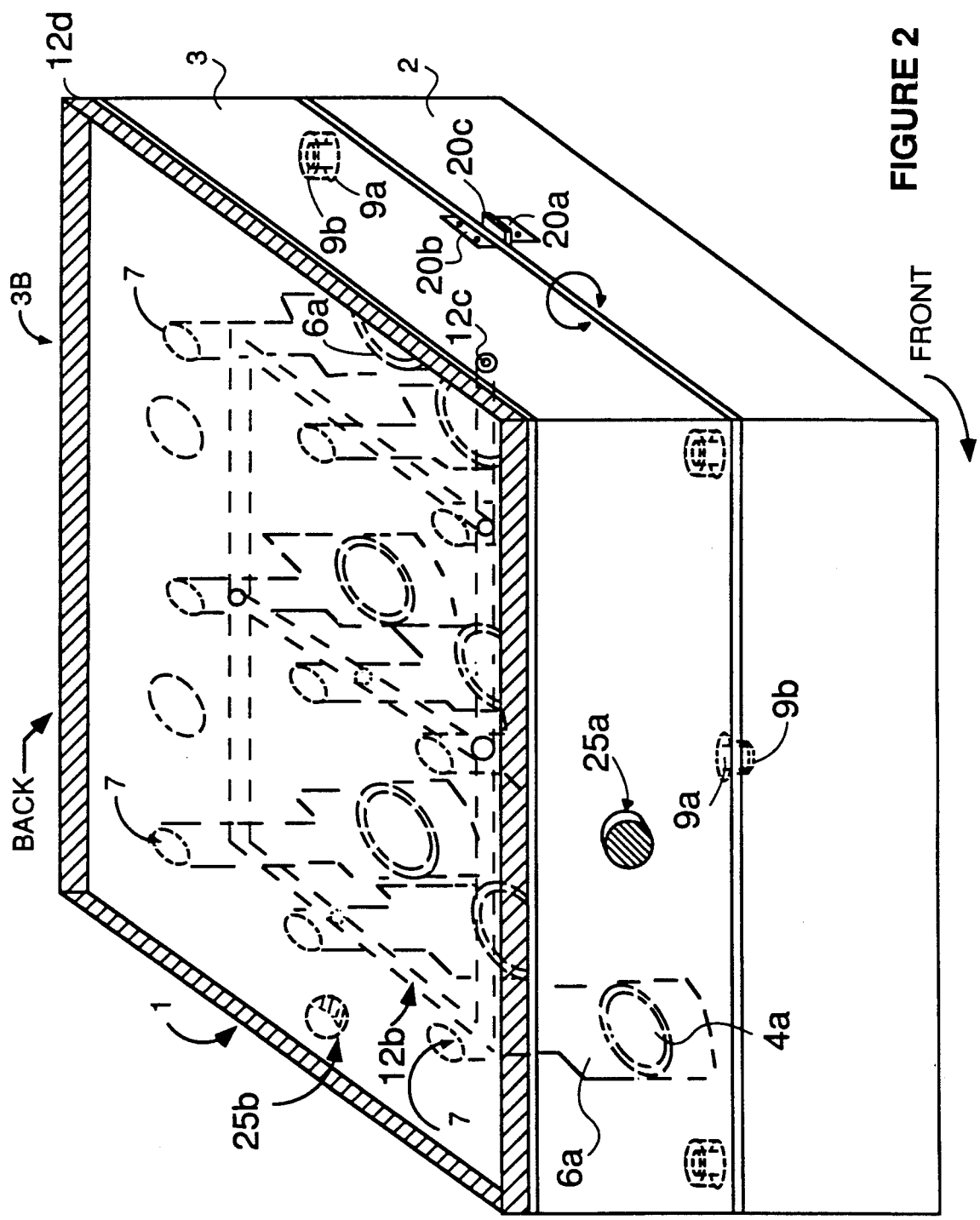
FIG. 2 illustrates first platen and second platen of the present invention in a sealing position.

In the preferred embodiment, first platen 2 and second platen 3 are held in close proximity using hinge means 20, as illustrated in FIGS. 1 and 2. Hinge means 20 is a three part hinge, wherein first hinge plate 20a is bolted to first platen 2 and second hinge plate 20b is bolted to second platen 3 and hinge pin 20c holds first and second hinge plates 20a, 20b in an operative association. Hinge means 20 allows second platen 3 to be moved around an axis of rotation, shown by the arrow in FIG. 2, so that first platen 2 and second platen 3 can be coupled in a sealing position, as described below and illustrated in FIG. 2. Hinge means 20 is preferably made from anodized aluminum except hinge pin 20c is a type 01 alloy of steel. For the preferred embodiment, hinge means 20 was custom made by the Inventors, to assist in the alignment of the platens. Hinge means 20 is just one way to physically rotate second platen 3 for the sealing position. Alternatively, second platen 3 can be rotated or inverted for the sealing position semiautomatically using air cylinders with a rotary actuator or automatically using microprocessor controlled air cylinders, for example, without going beyond the intended scope of the invention.

The first platen 2 and second platen 3 are operatively coupled in a sealing position so that accurate alignment of package 5 and lid 8 can be achieved. First platen 2 and second platen 3 are operatively coupled by physically inverting second platen 3, as described above, and aligning second platen 3 with first platen 2 using a platen alignment means 9 for aligning the first platen 2 and second platen 3 accurately into a sealing position, as illustrated in FIG. 2 Alignment of the platens 2, 3 automatically aligns the mating surfaces of package 5 and lid 8. Platen alignment means 9 can comprise a variety of mechanical or optical locators, such as laser beams, and preferably comprises platen alignment pins 9a and associated receiving holes 9b for receiving pins 9a, as illustrated in FIG. 2. Platen alignment pins 9a extend vertically from first platen 2 and second platen 3 for a distance, for example, and fit within respective reciprocal alignment pin receiving holes 9b in the platens 2, 3. Platen alignment pins 9a may extend from first platen 2 only or second platen 3 only, or preferably both. Each platen alignment pin 9a must have a reciprocal receiving hole 9b in the other platen with which to align. Platen alignment pins 9a are preferably made of hardened steel and are held to the respective platen using alignment bushing 9c also preferably made of hardened steel to minimize the wear and tear to them. Both platen alignment pins 9a and bushings 9c can be obtained from any supplier. For the invention, platen alignment pins 9a and bushings 9c were obtained from Rutland of California.

According to the preferred embodiment, handle means 25 was used to handle second platen 3 while second platen 3 is rotated manually into the sealing position. Handle means 25 is illustrated in FIGS. 1 and 2 and preferably comprises handles 25a and 25b. Handle means 25 is preferably made of a nonthermally conductive and rigid material, such as a rigid plastic, which can withstand continually exposure to temperatures around 200° C. without degradation. Handles 25a and 25b are located at the center of second platen 3 on the front and an adjacent side, respectively, opposite to the side where the hinge means 20 is located. Handle means 25 can be obtained as an off-the-shelf item from a handle distributor or supplier. For the preferred embodiment, the plastic handles were machined to a cylindrical shape so that the Inventor could drill a counter-bore hole and attach the handles to second platen 3. The handles were approximately 2⅜ inches long and ¾ inch in diameter. For the invention, handles 25a and 25b can be cylindrical or tapered, for example, and purchased with a center bore hole already drilled therein as off-the-shelf stock from any appropriate handle supplier. For the invention, handle means can be replaced by an automated platen rotator using robotics and/or microprocessor controlled manipulators, which can withstand the sealing temperatures associated with the invention and described below.

First and second platens 2, 3 are independently heated and independently thermostatically controlled. This allows lid 8 and package 5 to be inserted into package locator means 4 and lid locator means 6, respectively, and be heated to a sealing temperature independently. First platen 2 and second platen 3 are independently heated and thermostatically controlled by first heating means 10 and second heating means 11, respectively, preferably comprising long cylindrical heater cartridges which are inserted from the back to fit within holes in first platen 2 and second platen 3 running horizontally with the length of the platens, as illustrated in FIG. 1. Heater cartridges are available with different diameters and lengths and a variety of electrical specifications from many suppliers. For the preferred embodiment, heater cartridges were obtained from Watlow Electric Mfg., Company of Missouri. Heater cartridges were preferably ¼ inch in diameter embedded into ⅜ inch thick platens 2, 3.

A platen thickness of ⅜ inch was chosen for the invention to at least minimize the potential for hot spots and warpage. A ⅜ inch thick aluminum platen at least assures a constant and uniform temperature distribution and is less likely to warp than ½ inch thick aluminum. In the preferred embodiment, platens 2, 3 were eight inch square plates. Therefore, uniform temperature distribution and flatness were essential. Thinner aluminum plates were not used due to the increased risk of hot spots and lack of flatness over the eight inch square surface.

First and second heating means 10, 11 can be any means capable of heating the respective platens to the same temperature and with the same accuracy. For the invention, first heating means 10 has been calibrated to second heating means 11 with substantial uniformity of temperature, preferably within ±3° C. First and second heating means 10, 11 are capable of heating their respective platen from room temperature to at least 200° C. In the preferred embodiment, a sealing temperature set point between 150° C. and 185° C. is established and the set point will depend upon at least the adhesive used for sealing.

As illustrated in FIG. 2, second platen 3 is inverted into a sealing position over first platen 2. In the sealing position, platen alignment pins 9a of first and second platens 2, 3 fit within respective pin receiving holes 9b of the platens 2, 3, thereby assuring accurate alignment of the preferred embodiment. When lid 8 is inserted in lid locator means 6, it must be held in place while second platen 3 is inverted. Therefore, second platen 3 is equipped with a holding means 12 for holding lid 8 within lid locator means 6 while second platen 3 is inverted. Holding means 12 can be a mechanical means for holding, or preferably a vacuum 12a which is controllable on the exterior of apparatus 1.

For the preferred embodiment, vacuum is pumped to individual lid locator means 6 using vacuum lines 12b and vacuum inlet 12c, as illustrated in FIG. 2. Vacuum lines 12a are applied to lid 8 via second through-hole 7. Therefore, before vacuum holding means 12a can be asserted, second through-holes 7 must be closed off from side 3B of second platen 3. For the preferred embodiment, second through-holes 7 were covered with a flexible sheet 12d, preferably of RTV silicone rubber. Flexible sheet 12d should withstand continually temperature exposures to 200° C. and remain flexible to mold itself to the contours of side 3B of second platen 3 when vacuum is asserted. Flexible sheet 12d should also be thermally insulative, so that the uniform temperature distribution over apparatus 1 is not disturbed.

When vacuum is ON, lid 8 sits within lid locator means 6 such that an adhesive 13 coated on the mating surfaces of lid 8, does not contact the mating surfaces of package 5 when the platens are in the sealing position, as illustrated in FIGS. 3A and 3B. In the preferred embodiment, the distance A separating the mating surfaces of package 5 and lid 8 when in the sealing position with vacuum ON ranges from approximately 0.003 inches to 0.025 inches. This distance does not include the thickness of adhesive coating 13.

When vacuum is OFF, lid 8 falls with the force of gravity only vertically to contact package 5. The spacing A between first platen 2 and second platen 3 is designed so that as lid 8 falls, it is guided by the contours of lid locator means 6 to align accurately with the mating surface of package 5. For the preferred embodiment, at least 0.005 vertical inch of lid 8 remained within lid locator means 6 after vacuum was turned OFF and lid 8 contacted package 5, as illustrated in FIG. 4A. This assured accurate lid alignment even though lid 8 was free to move vertically. Moreover, adhesive 13 softened as the temperature increased above 50° C. and was sufficiently liquefied when lid 8 contacted package 5 to provide a floating medium to cushion the impact.

Figure 5:
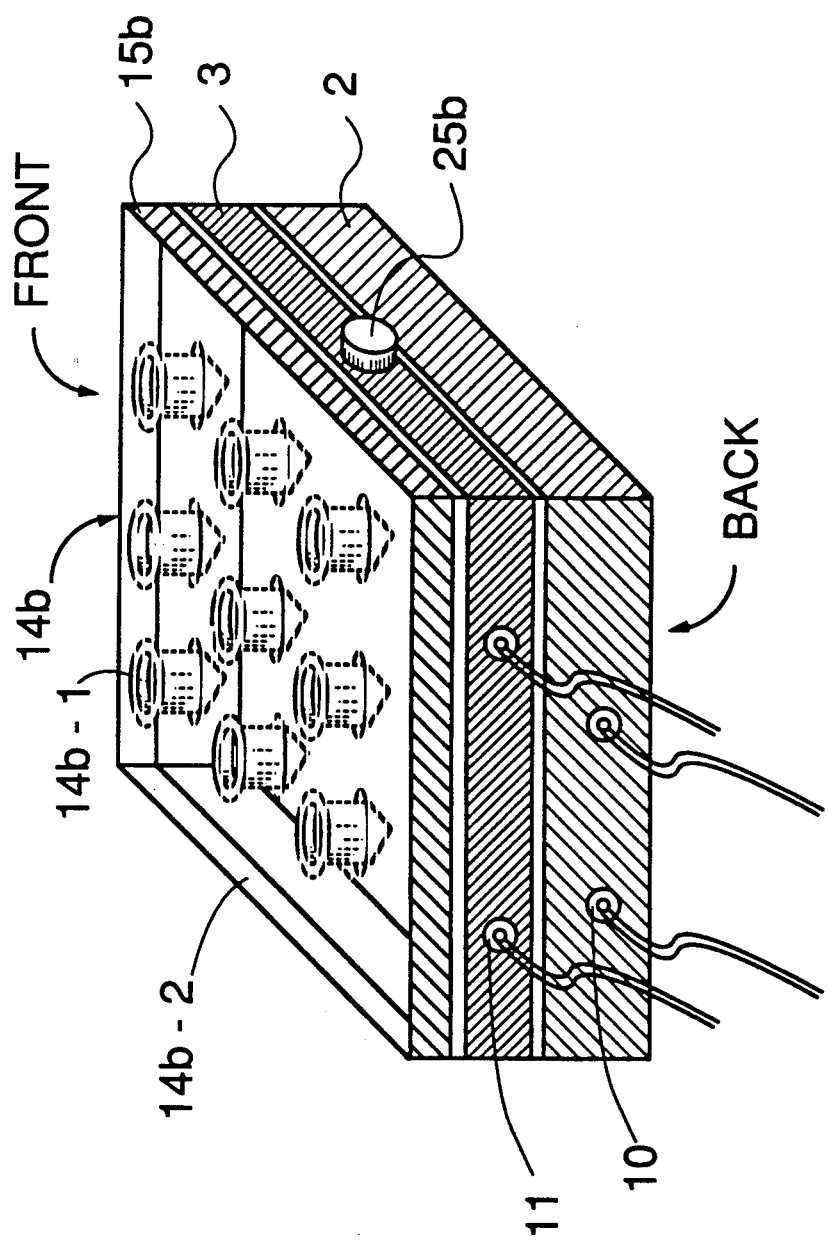
FIG. 5 is a plan view illustrating means for applying constant pressure to the lid of FIG. 4B.

Second through-hole 7 associated with receptacle 6a connects receptacle 6a on side 3A of second platen 3 internally to side 3B of second platen 3. As illustrated in FIGS. 3A and 3B, second through-hole 7 is located at the geometric center of receptacle 6a. Second through-hole 7 provides access to lid 8 in receptacle 6a when apparatus 1 is in the sealing position. Second through-hole 7 is smaller in diameter than receptacle 6a, but large enough to fit a means 14 for contacting lid 8 therethrough. Means 14 for contacting lid 8 through second through-hole 7 can be an individual probe means 14a, as illustrated in FIG. 4A, or a plurality of probe-like protrusions 14b-1 from a fourth platen 14b-2 in the same configuration as the plurality of receptacles 6a each having a second through-hole 7 on second platen 3, as illustrated in FIG. 4B. Therefore, individual probe means 14a for contacting lid 8 can be used to contact each lid 8 individually or plural probe means 14b can contact a plurality of lids 8 at the same time by placing fourth platen 14b-2 over second platen 3 so that the plurality of protrusions 14b-1 are inserted into the plurality of second through-holes 7, as illustrated in FIG. 5.

Means 14 for contacting lid 8 also comprises a means 15 for applying constant pressure to lid 8 through second through-hole 7. Means 15 for applying constant pressure can be the platen weight 15b of fourth platen 14b-2 of plural probe means 14b, as illustrated in FIGS. 4B and 5, or an individual weight 15a attached to individual probe means 14a, as illustrated in FIG. 4A. Individual probe means 14a is preferably made by attaching a probe having a semipointed tip at a probe end and whose opposite end is fastened at a centerpoint on weight 15a. Weight 15a can be a 10 to 100 gram weight and the probe is preferably made of a nonthermally conductive material, such as wood, or teflon, which will contact lid 8 without drawing away heat from the lid. The probing portion 14b-1 of plural probe means 14b is preferably made of a non thermally conductive material, such as teflon, wood, or the like which can be fastened to fourth platen 14b-2. Fourth platen 14b-2 should be made of metal and is preferably made of aluminum. Alternatively, a pneumatic piston or air cylinder may be used which is illustrated in FIG. 6 for a third embodiment.

According to the invention, pressure means 15 can apply at least approximately 10 grams of pressure at or near the geometric center of lid 8 as defined by second through-hole 7. The amount of pressure necessary will vary with the size of the package and lid to be sealed. For the preferred embodiment, 30 grams of pressure was applied to a ceramic lid, having dimensions of 0.5″ diameter being sealed to a microwave package using RJ-4B adhesive, but other types of lids may require up to 100 grams. Pressure means 15 can be designed to apply up to 250 grams of pressure. Pressure can be applied at least instantaneously or for longer periods of time. For the preferred embodiment, pressure was applied for 2 seconds.

The process for sealing together packages 5 and lids 8 with adhesive 13, according to the invention, comprises the steps of preheating package 5 and lid 8, lid 8 having a mating surface coated with adhesive 13; and mating together the heated package 5 and heated lid 8. The process according to the invention is preferably accomplished by the steps described below. Heated package 5, or a plurality of packages 5, is placed into package locator means 4 of heated first platen 2. First platen 2 is heated by first heating means 10 which is thermostatically controlled and can heat first platen 2 to a sealing temperature set point preferably between 150° C. and 185° C., when package 5 is inserted. A temperature equilibrium is established within approximately six minutes depending on the mass of the package and whether or not the package itself has been preheated just prior to insertion in first platen 2.

Alternatively, package 5 can be at room temperature and first platen 2 at the sealing temperature when package 5 is placed into package locator means 4 of heated first platen 2. After placement is complete, package 5 therein is allowed to be heated to the preferred sealing temperature set point between 150° C. and 185° C. This alternative step would take longer to reach an equilibrium set point temperature but eliminates potential losses of delicate electronic circuitry, resulting from handling the packages numerous times before the electronic circuitry inside the package is protected by a lid.

Lid 8, or a plurality thereof, is placed into lid locator means 6 of heated second platen 3. Lid 8 is placed into lid locator means 6 with adhesive 13, already affixed to the mating surface of lid 8, facing out of lid locator means 6 when the lid is placed. Lid 8 can be placed into lid locator means 6 of second platen 3 before, simultaneously, or subsequent to the placement of package 5 in first platen 2, described above. Second platen 3 is independently heated by second heating means 11. The temperature of second platen 3 should be the same as that established for first platen 2 and described above. Temperature equilibrium is achieved in approximately 0 to 3 minutes, depending upon the temperature of lid 8 when it is inserted into lid locator means 6. The accuracy and the setting of the temperature of first platen 2 and second platen 3 must be the same for the preferred embodiment. When lid 8 is inserted, holding means 12 is asserted for holding lid 8 in place. Vacuum holding means 12a accesses lid 8 via vacuum lines 12b in second through-hole 7 and is controllable externally to second platen 3 for turning ON and OFF. Approximately 15 inches of vacuum is necessary to hold one to 25 lids simultaneously in lid locator means 6 of second platen 3. After vacuum holding means 12a is turned ON, flexible sheet 12d is held to side 3B of second platen 3 by the vacuum to close off second through-holes 7. Second platen 3 is inverted and placed on first platen 2 using the assistance of hinge means 20 and handle means 25 and aligned together using platen alignment means 9 for accurately aligning the platens together into a sealing position. Platens 2, 3 are maintained at the established set-point temperature mentioned above during this step.

After suitable time to assure temperature equilibrium among lid 8, liquefying adhesive 13, package 5, and an air space within the package 5 and lid 8 cavities, preferably 0 to 10 minutes, vacuum holding means 12a is turned OFF and lid 8 is simultaneously released and allowed to fall, guided by lid locator means 6, onto package 5. In effect, lid 8 floats on the mating surface of package 5 due to the liquefaction of adhesive 13 during the continuous heat exposure while held on second platen 3. When lid 8 falls, it falls with the force of gravity preferably less than 0.025 inches to contact package 5. At least 0.005 inches of lid 8 remains within lid locator means 6 even after contact is made with package 5 to keep lid 8 from shifting as it floats on package 5 after contact. During this step the pre-established set point temperature between 150° C. and 185° C. is maintained.

Depending on the reactivity characteristic or gel time of the adhesive formulation, and preferably within 0.1 second to 6 minutes, pressure of at least 10 grams magnitude is applied at or near the geometric center of the lid. Pressure is applied using probe means 14 for contacting lid 8 through second through-hole 7 and pressure means 15 to apply constant pressure to lid 8. This pressure causes the adhesive to flow and fill any voids, indentations or cavities within the seal area and to identify the thickness of adhesive between lid 8 and package 5 mating surfaces. The duration of the pressure application may be instantaneous or the pressure may be applied longer, such as continuously for the duration of the heating cycle. While pressure is being applied, the temperature of the fixture 1 is maintained at the pre-established set point between 150° C. and 185° C.

As soon as the adhesive 13 has reacted sufficiently to the temperature and pressure exposure so that it remains dimensionally stable and capable of withstanding drastic temperature changes without losing integrity, the sealed package may be removed from apparatus 1 for inspection, testing, and subsequent completion of the adhesive cure cycle by post-curing. Adhesives generally become dimensionally stable when they are approximately 85% cured. Moreover, a sealed package 5a is more readily reworked, should it have a poor seal, when the adhesive is not fully cured. At 85% cure, the package seal may be tested to determine if it leaks by a gross leak test. The gross leak test is accomplished by submerging the entire sealed package 5a into a bath of liquid, such as a fluorocarbon, at a constant temperature, typically ranging from 100° C. to 125° C. depending on the customer's criteria (i.e., military or commercial). The bath is enclosed in a transparent material so that the package is readily visible when submerged in the bath. After one minute, the package is observed from the bath for bubbles exiting at the seal surface. If no bubbles are detected after one minute, the sealed package is deemed to meet the sealing criterion. When bubbles are detected, the package seal can be reworked by removing the lid and adhesive and repeating the process according to the invention with a new lid 8 having adhesive 13 coating. For the preferred embodiment, RJ-4B adhesive was used and became dimensionally stable for testing within 15 minutes of mating package 5 and lid 8 together.

Apparatus 1 is disassembled by removing second platen 3 from first platen 2 and removing sealed package 5a from first platen 2. Once removed from apparatus 1, sealed package 5a is placed on a metal tray to cool to room temperature. Throughout the entire process, the first platen 2 and second platen 3 remain at a constant set point temperature. The sealed packages are removed from the hot platen in a hot condition and placed on a room-temperature metal tray to cool. Therefore, this may be the first drastic temperature change to which sealed package 5a will be exposed.

The full cure cycle of a particular adhesive may range from 5 minutes to 2 hours or more. This depends on the adhesive formulation chosen for the sealing process. RJ-4B adhesive of the preferred embodiment was post cured for one hour.

The process according to the present invention is a technique for sealing electronic devices using beta-staged epoxy, modified epoxy or similar thermosetting adhesives and sealants such as polyimides. The fixture 1 according to the present invention can have a single position package locator means 4 and lid locator means 6 to seal one package at a time, or multiple positions reaching to 100 or more. In a workstation configuration which would be manually loaded, a typical size would range from 4 to 25 package and lid locator means 4 and 6, respectively, on an eight inch square apparatus 1. The number and configuration of package and lid locator means 4 and 6, respectively, in FIGS. 1, 2 and 5 are merely illustrative and not intended to limit the scope of the invention. For the preferred embodiment, a 16 positions package and lid locator means was used.

Product literature from the major suppliers of beta-staged package sealing adhesives state clearly that clamping forces, applied uniformly, of one kilogram or more must be maintained throughout the heating cycle, including cooling. In this invention, there is zero external pressure required during both heat-up and cool-down. The literature clearly states that rapid heat-up is necessary to minimize blow-outs or "leakers". This is a recognition that the cavity gas pressure must be relieved by out-gassing bubbles before the adhesive begins to set, as described above. In current practice, the clamps used in the prior art range from small compression springs in multiple fixtures to silicone rubber foam rigidly clamped to the package. Singular clips are available for several dollars each but some major producers actually use paper clips.

A major advantage of the iso-thermal seal process is that it can be used for a wide variety of adhesive formulations. As long the parts are mated under constant temperature conditions and held under these conditions until the material sets and is dimensionally stable, the process works. However, in electronics applications there are many difficult performance criteria which must be met. They are readily identified in U.S. MIL STD 883, which is currently the industry standard. These severe requirements have resulted in commercial availability of less than 10 acceptable adhesive formulations as sealants. Those materials which require clamping throughout the cure cycle may not be aided by this process. However, there are formulations in commercial use which match up well with the iso-thermal seal process advantages such as RJ-4B from RJR Polymers, California.

The process and apparatus according to the invention can be used for sealing any type of package and lid. For instance, the invention is applicable to the sealed components of optical scanning equipment and video cameras.

Some of the initial attempts to create a process with predictable and highly reliable package seals involve modifications of the adhesive formulations to change rheology and gel characteristics. Yield improvements were made but substantial variabilities still prevailed. Vacuum sealing was explored in depth with very limited improvements and much higher sealing costs.

In a third embodiment illustrated in FIGS. 6A and 6B, apparatus 50 comprises first platen 2a and second platen 3a. First platen 2a has package locators or recesses 4e for packages 54, for example, and first through-hole 4d through first platen 2. Second platen 3a has lid locators 6b without associated through-holes. Instead second platen 3a only has vacuum holding means 12f. Therefore, a flexible sheet, such as 12d, is not necessary, since vacuum line 12f is closed off from side 3B-1 of second platen 3a. Lid 53 is held by vacuum-holding means 12f in much the same way as described above.

The process according to the third embodiment differs from the process described above only in the application of pressure. First heating means 10a and second heating means 11a heat first platen 2a and second platen 3a in the same way as described above for the other embodiments. For the third embodiment, when heated platens 2a and 3a are placed in a sealing position, as illustrated in FIG. 6A, lids 53, having adhesive 13 applied to the mating surfaces thereof, are held above packages 54 with holding means 12f. In this embodiment, holding means 12 can be a mechanical means for holding instead of vacuum. After a suitable time for the package, lid, adhesive and associated air space between the lid and the package to reach a temperature equilibrium, lids 53 are released to contact packages 54, as illustrated in FIG. 6B. Rather than a means 14 for contacting lids 53, this embodiment uses means 56 for contacting packages 54 from side 2B-1 of first platen 2a. Package contacting means 56 preferably comprises miniature air cylinders 56a which move vertically through first through-holes 4d to contact a bottom surface of package 54. Air cylinders 56a can be obtained as an off-the-shelf item from Bimba of Illinois, for example. For the preferred embodiment of the third embodiment, miniature air cylinders 56a have Viton O-rings which withstand the continual temperature exposures around 200° C. Alternatively, an air cylinder having Viton O-rings can be obtained from SMC of Japan. The SMC air cylinder is more compact so that more room is available under plate 56b, which holds the air cylinders.

Package contacting means 56 further comprises air lines 56c which provide air to run the pneumatic system. Air cylinders 56a are preferably nose-mounted to plate 56b and the shaft 56d which moves through first through-hole 4d can be made of a nonthermally conductive material such as wood or preferably teflon.

FIG. 6B illustrates positions X and Y of FIG. 6A, after lids 53 have been released. Air cylinder positioning shown in FIGS. 6A and 6B is merely illustrative and preferably cylinders move together to apply pressure to packages 54 at the same time. Position X illustrates on FIG. 6B when shaft 56d-1 of air cylinder 56a-1 has not yet moved vertically to contact package 54. Position Y illustrates when shaft 56d-2 of air cylinder 56a-2 has contacted package 54 and moved package 54 and lid 53 with adhesive 13 therebetween into lid locator means 6b, thereby applying pressure to the seal interface. Package contacting means 56 can use hydraulic-driven instead of air driven cylinders and can be automated.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. An iso-thermal sealing apparatus for sealing together an electronic package with a thermosetting adhesive comprising:

a first planten for holding a package, said first platen having a first means for heating said first platen and said package;

a second platen for holding a lid, said second platen having a second means for heating said second platen and said lid, said second platen being operatively coupled to said first platen, wherein said first platen and said second platen provide iso-thermal conditions for said package and said lid when said first platen and said second platen are in a sealing position.

2. The apparatus according to claim 1, wherein said first platen comprises a package locator means for positioning said package.

3. The apparatus according to claim 2, wherein said package locator means is a slot dimensionally sized to hold said package.

4. The apparatus according to claim 3, wherein said slot has a first through-hole, said first through-hole for accessing said package when said first platen and second platen are in a sealing position.

5. The apparatus according to claim 2, wherein said package locator means is a plurality of package locator pins, said plurality of package locator pins being placed to hold said package.

6. The apparatus according to claim 2, wherein said second platen comprises a lid locator means for positioning said lid.

7. The apparatus according to claim 6, wherein said lid locator means comprises a second through-hole and a receptacle portion, said receptacle portion for positioning said lid and said second through-hole for accessing said lid when said first platen and said second platen are in said sealing position.

8. The apparatus according to claim 6, wherein said first heating mans and said second heating means uniformly heat said first platen and said package and said second platen and said lid, respectively, and adjustable have the same setting capability and accuracy.

9. The apparatus according to claim 8, wherein said second platen is physically inverted when operatively coupled with said first platen in said sealing position.

10. The apparatus according to claim 9, wherein said second platen still further comprises means for holding said lid to said second platen, said means for holding being capable of suspending said lid above said package when said second platen is aligned with said first platen in said sealing position.

11. The apparatus according to claim 10, wherein said means for holding said lid is a vacuum, said means for holding being controllable for releasing said lid.

12. The apparatus according to claim 10, wherein said first platen and said second platen are made of metal.

13. The apparatus according to claim 12, wherein said first platen and said second platen are made from anodized aluminum.

14. The apparatus according to claim 12, wherein said first platen is operatively coupled to said second platen with a platen alignment means for aligning said second platen accurately upon said first platen in said sealing position.

15. The apparatus according to claim 14, wherein said platen alignment means comprises a plurality of platen alignment pins and a plurality of pin receiving holes, said plurality of pins and said plurality of holes being located reciprocally and alternatively on said first platen and said second platen.

16. The apparatus according to claim 15, wherein said second platen further comprises handle means for handling said second platen when operatively coupling said second platen to said first platen.

17. The apparatus according to claim 16, wherein said first platen and said second platen further comprise a hinge means for holding said first platen and said second platen in close proximity and facilitating said operative coupling into said sealing position.

18. An iso-thermal sealing process for electronic devices using a thermosetting adhesive comprising the steps of:
  preheating an entire package and an entire lid, said lid having a mating surface coated with said thermosetting adhesive; and
  mating together said heated package and said heated lid when iso-thermal conditions between said package, said lid and a surrounding medium are achieved.

19. An iso-thermal sealing process according to claim 18 wherein said step of mating together comprises the steps of:
  operatively coupling a first heated platen holding said heated package with a second heated platen holding said lid, said operatively coupling automatically achieving alignment between said package and said lid;
  releasing said heated lid from said second heated platen after a suitable time to assure temperature equilibrium among said lid, said package and an associated air space within said package and said lid, said lid moving only in a vertical direction, said mating surface of said lid coated with said thermosetting adhesive contacting a mating surface of said package;
  applying pressure to said mating surfaces for a duration at least instantaneously while maintaining said temperature equilibrium; and
  heating said package, said thermosetting adhesive and said lid at least until said thermosetting adhesive is gelled.

20. The process according to claim 19, wherein said suitable time before releasing said lid ranges from zero to ten minutes.

21. The iso-thermal sealing process according to claim 20, wherein the step of preheating comprises preheating said package and said first heated platen independently form preheating said lid and said second heated platen.

22. The sealing process according to claim 21, wherein said first platen holding said package and second platen holding said lid are separately preheated to a temperature range from 150° C. to 185° C. with substantial uniformity of temperature.

23. The sealing process according to claim 22, wherein said temperature range remains constant for the duration of said sealing process.

24. The sealing process according to claim 19, wherein said pressure is applied through a second through-hole in said second platen with a second probe means for contacting said lid.

25. The sealing process according to claim 19, wherein said pressure is applied through a first through-hole in said first platen with a first probe means for contacting said package.

26. An apparatus for sealing together an electronic package comprising:
  a first platen for holding a package, said first platen comprising a first means for hating said first platen and said ENTIRE package; and
  a second platen for holding a lid, said second platen comprising a second means for heating said second platen and said ENTIRE lid, and a handle means for handling said second platen, said second platen being operatively coupled to said first platen to achieve automatic alignment of said package and said lid in a sealing position.

27. An apparatus for sealing together an electronic package comprising:
  a first platen for holding a package, said first platen comprising a first means for heating said first platen and said ENTIRE package; and
  a second platen for holding a lid, said second platen comprising a second means for heating said second platen and said ENTIRE lid, said first platen and said second platen further comprising hinge means for operatively coupling said first platen and said second platen into a sealing position.

28. A sealing process for electronic devices using an adhesive comprising the steps of:
  preheating a package and a lid, said lid having a mating surface coated with said adhesive; and
  mating together said heated package and said heated lid when temperature equilibrium among said lid, said package, and an associated air space within said package and said lid is at a curing temperature of said adhesive, wherein said step of mating together comprises applying pressure to said mating surface through a first through-hole in said first platen with a first probe means for contacting said package.

* * * * *